United States Patent [19]
Okanoue

[11] Patent Number: 5,272,727
[45] Date of Patent: Dec. 21, 1993

[54] ADAPTIVE MAXIMUM LIKELIHOOD SEQUENCE ESTIMATOR USING CHANNEL ESTIMATORS OF RESPECTIVE ORDER OF IMPULSE RESPONSE

[75] Inventor: Kazuhiro Okanoue, Tokyo, Japan
[73] Assignee: NEC Corporation, Japan
[21] Appl. No.: 891,641
[22] Filed: May 29, 1992

[30] Foreign Application Priority Data
May 29, 1991 [JP] Japan .................................. 3-125753

[51] Int. Cl.$^5$ ............................................. H04L 27/06
[52] U.S. Cl. ........................................ 375/94; 375/99; 371/43
[58] Field of Search ...................... 375/38, 40, 14, 94, 375/100, 102, 101, 99; 455/133, 132, 137, 296; 371/43, 44, 45

[56] References Cited
U.S. PATENT DOCUMENTS
| | | | |
|---|---|---|---|
| 4,862,483 | 8/1989 | Clark | 375/94 |
| 4,885,757 | 12/1989 | Provence | 375/96 |
| 5,065,411 | 11/1991 | Muto | 375/100 |
| 5,127,025 | 6/1992 | Okanoue | 455/135 |

OTHER PUBLICATIONS
Digital Communications, John G. Proakis, McGraw-Hill, Second Edition, pp. 624–627.

*Primary Examiner*—Stephen Chin
*Attorney, Agent, or Firm*—Ostrolenk, Faber, Gerb & Soffen

[57] ABSTRACT

An adaptive sequence decoder comprises a maximum likelihood sequence estimator for deriving a decision sequence of a received signal in response to a control signal. Channel estimators of zero-th to m-th order of channel impulse response are connected to the MLSE to produce a first signal representing a respective order of a replica of a transmitted signal and a second signal representing a respective order of channel impulse response. The first signals from the channel estimators are summed to produce the replica of the transmitted signal for comparison with the received sequence to produce an error signal, and the second signals are summed to produce the control signal. At periodic intervals, the MLSE control signal is initialized and the zero-th order channel estimator is reset to the initialized control signal, and the other channel estimators are reset to respective initial values to prevent time dispersion.

6 Claims, 4 Drawing Sheets

ADAPTIVE MAXIMUM LIKELIHOOD SEQUENCE ESTIMATOR USING CHANNEL ESTIMATORS OF RESPECTIVE ORDER OF IMPULSE RESPONSE

BACKGROUND OF THE INVENTION

The present invention relates generally to digital communication systems, and more particularly to maximum likelihood sequence estimation for estimating a symbol sequence such as convolutional codes received via a communication channel having a time-varying impulse response.

Maximum likelihood sequence estimation is a well known technique for recovering a transmitted information sequence corrupted by intersymbol interference. The Viterbi algorithm is usually employed for implementation. Decoding a received symbol sequence using the Viterbi algorithm requires knowledge of the impulse response of the communication channel. If the communication channel is time-varying, an adaptation technique is necessary. As discussed in Digital Communications, John G. Proackis, McGraw-Hill, Second Edition, pages 624 et seq., a channel estimator is connected in parallel with a maximum likelihood sequence estimator (MLSE) to detect the impulse response of the channel with which the MLSE algorithm is adaptively controlled.

However, the prior art channel estimator is based on the first-order LMS (Least Mean Square) algorithm and is, therefore, incapable of adaptation to rapidly varying channel characteristics.

SUMMARY OF THE INVENTION

It is therefore an object of the present invention to provide an adaptive maximum likelihood sequence estimator capable of tracking the rapidly varying impulse response of a communication channel.

The adaptive maximum likelihood sequence estimator of the present invention comprises a maximum likelihood sequence estimator (MLSE) for deriving a decision sequence of a received signal from an estimate of the impulse response of a communication channel. Channel estimators are provided respectively for zero-th order through m-th order of channel impulse response. Each of the channel estimators operates on a time-count value and responds to an error signal and the decision sequence by deriving therefrom a first signal representing a respective order of a replica of the transmitted signal and a second signal representing a respective order of the channel impulse response. The first signals from the channel estimators are summed by a first summing circuit to produce a replica of the transmitted signal for comparison with the received signal to produce the error signal, and the second signals are summed by a second summing circuit to produce a signal that controls the maximum likelihood sequence estimator to reduce the error. Reset means are provided for periodically resetting the (m+1) channel estimators to prevent time divergence.

In a preferred embodiment, each channel estimator includes a delay line to which the decision sequence from the MLSE is applied, a first, raise-to-power multiplier for raising the time-count value to a power corresponding to the order of the channel estimator and a plurality of second multipliers for multiplying the power-raised time-count value with components of a decision sequence respectively appearing at successive taps of the delay line. The second summing circuit comprises a plurality of raise-to-power multipliers of zero-th to m-th order for raising the time-count value to powers of respective order to produce a plurality of power-raised time-count values which are multiplied respectively with the second signals from the (m+1) channel estimators and summed to produce the MLSE control signal. At periodic intervals, the MLSE control signal is initialized and the zero-th order channel estimator is reset to the initialized control signal, and the other channel estimators are reset to respective initial values to prevent time dispersion.

BRIEF DESCRIPTION OF THE DRAWINGS

The present invention will be described in further detail with reference to the accompanying drawings, in which.

DETAILED DESCRIPTION

The present invention is based on a hypothesis that the time-varying impulse response of a communication channel can be represented by an m-th order equation. To achieve a higher speed tracking performance than is attainable with the prior art system, an m-th order communication channel impulse response estimation technique is employed. By denoting an impulse response vector $\vec{h}(k)$ as follows, $$\vec{h}(k) = \vec{h}(k,m) \cdot t^m + \vec{h}(k,m-1) \cdot t^{m-1} + \ldots + \vec{h}(k,1) \cdot t + \vec{h}(k,0) \quad (1)$$

the coefficients of Equation (1) are determined as an estimate of the channel impulse response at time "t" (where the vector $\vec{h}(k,j)$ represents a j-th order channel impulse response at time "k" and where $0 \leq j \leq m$).

Figure 1:
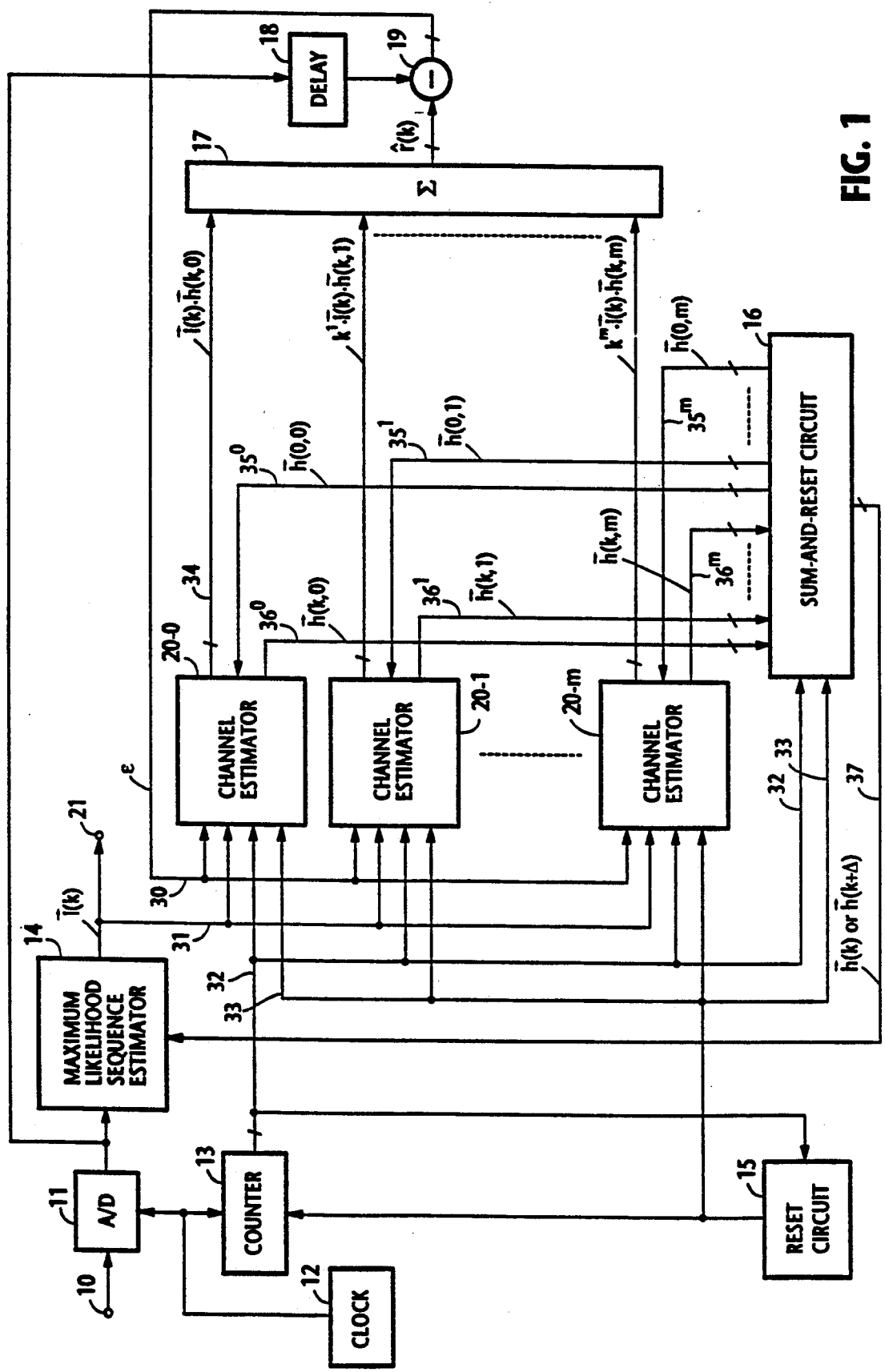
FIG. 1 is a block diagram of an adaptive maximum likelihood sequence estimator according to the present invention.

In FIG. 1, a block diagram of an adaptive maximum likelihood sequence estimator is illustrated. An incoming sequence of convolutional code symbols is received through an input terminal 10 and applied to an analog-to-digital converter 11 where it is sampled in response to clock pulses from a clock source 12 and converted to digital values. The output of A/D converter 11 is fed into a conventional maximum likelihood sequence estimator (MLSE) 14 such as Viterbi decoder, and further supplied to a delay circuit 18. By using an impulse response estimate from a sum-and-reset circuit 16, MLSE 14 provides demodulation on the received digital sequence to produce a system output, or decision sequence which is represented by a vector $\vec{i}(k)$ for delivery to an output terminal 21.

The output of MLSE 14 is further applied through lead 31 to channel estimators 20-0, 20-1 . . . 20-m to produce 0-th to m-th order estimates represented by vectors $t^j \cdot \vec{i}(k) \cdot \vec{h}(k,j)$, or components of a replica of the original signal for coupling through lead 34 to an adder 17 in which they are summed to produce an output represented by a vector $\vec{r}(k)$.

The effect of delay circuit 18 is to delay the digital sequence from A/D converter 11 by an amount substantially corresponding to the time taken for MLSE 14 to decode that signal, so that the inputs at the subtractor 19 are time coincident with each other. The output vector from adder 17 is applied to a subtractor 19 and a difference between it and the delayed version of the incoming digital sequence is detected to produce an error signal $\epsilon$. This error signal $\epsilon$ is applied to all impulse response estimators 20-j through lead 30. The impulse response estimators 20-j further produce 0-th to m-th order impulse response time-varying components $\bar{h}(k,j)$ for coupling to the sum-and-reset circuit 16 via respective lines 36$^j$ (where j=0, 1, 2 ... m).

As will be described, all channel estimators 20-j are periodically reset in response to reset signals represented by vectors $\bar{h}(R,j)$ supplied from the sum-and-reset circuit 16 through respective leads 35$^j$ to prevent the channel estimators 20-j from diverging. To this end, a counter 13 and a reset circuit 15 are provided for counting the clock pulse and resetting the count when it attains a prescribed value. The outputs of counter 13 and reset circuit 15 are respectively coupled through leads 32 and 33 to all impulse response estimators 20, and further to the sum-and-reset circuit 16 to derive the reset signals.

In mathematical terms, the communication channel impulse response can be represented by the following relation:

$$r(k) = \vec{i}(k) \cdot \vec{h}(k) \quad (2)$$

where $\hat{r}(k)$ represents a replica of the original signal at time k. For simplicity, it is assumed that a communication channel of length 3 is employed (i.e., the magnitude of the vectors $\bar{h}(k,j)$ and $\vec{i}(k)$ is 3). Then, the vectors $\vec{i}(k)$ and $\vec{h}(k)$ are respectively given by Equations (3) and (4) as follows:

$$\vec{i}(k) = (i(k), k(k-1), i(k-2)) \quad (3)$$

$$\vec{h}(k) = \vec{h}(k,m) \cdot k^m + \vec{h}(k,m-1) \cdot k^{m-1} + \ldots + \vec{h}(k,1) \cdot k + \vec{h}(k,0) \quad (4)$$

where, $\bar{h}(k,j)$ is given by:

$$\vec{h}(k,j) = \begin{bmatrix} h(k, j, 0) \\ h(k, j, 1) \\ h(k, j, 2) \end{bmatrix} \quad (5)$$

The following relation is given by substituting Equations (3), (4) and (5) into Equation (2):

$$\hat{r}(k) = \sum_{j=0}^{m} k^j \vec{i}(k) \cdot \vec{h}(k,j) \quad (6)$$

$$= \sum_{j=0}^{m} k^j \{h(k,j,0)i(k) + h(k,j,1)i(k-1) + h(k,j,2)i(k-2)\}$$

Equation (6) indicates that the replica $\hat{r}(k)$ can be represented by a linear summation of $k^j$ terms and that the coefficient vector $\bar{h}(k,j)$ of each order can be independently obtained.

As will be described with reference to FIG. 2 hereinbelow, each channel estimator 20-j is designed to operate on the LMS (Least Mean Square) algorithm. The following Equation is used to determine the j-th order coefficient vector $\bar{h}(k,j)$:

$$\vec{h}(k+1,j) = \vec{h}(k,j) + \epsilon \Delta_j \vec{i}(k) \cdot k^j \quad (7)$$

where $\Delta_j$ is the step-size which can be appropriately determined. By substituting Equation (7) into Equation (4), the vector $\bar{h}(k)$ of the channel estimate can be updated and wherein the letter k denotes a time lapse and is treated as a monotonically increasing variable. Therefore, the variable $k_j$ increases indefinitely over time as calculation of Equation (7) proceeds, and the control system would enter the state of a divergence. To prevent this, the vector $\bar{h}(k,j)$ is reset at periodic intervals according to the following Equations:

$$\vec{h}(R, 0) = \sum_{j=0}^{m} (R - 1)^j \vec{h}(R - 1, j) \quad (8)$$

$$\vec{h}(R, j) = \vec{h}(R - 1, j) \; (j = 1, 2, \ldots m) \quad (9)$$

where R is an initial value to which the k-value is to be periodically initialized. More specifically, the k-value is reset to zero at periodic intervals in response to the output of reset circuit 15.

Figure 2:
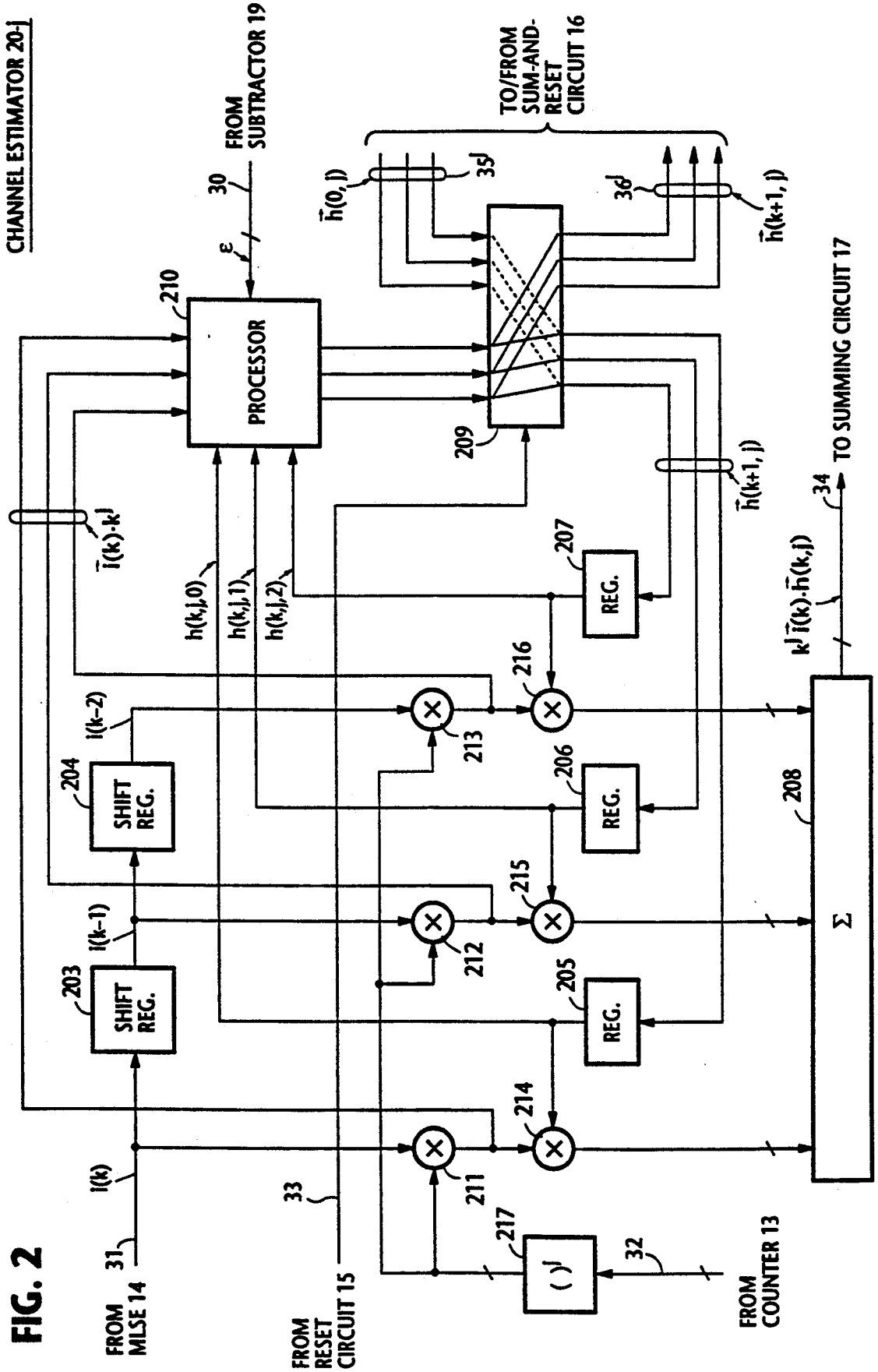
FIG. 2 is a block diagram of each of the channel estimators of FIG. 1.

FIG. 2 is a block diagram of the channel estimator 20-j. The estimator 20-j includes shift registers 203 and 204 that are connected in series to the output of MLSE 14 to form a delay line having successive taps. At a given instant of time k, a sequence of channel estimates i(k), i(k−1) and i(k−2) appear at the successive taps of the delay line and are applied to multipliers 211, 212 and 213, respectively, in which they are multiplied with the output of a j-th power multiplier 217 to which the output of clock counter 13 is applied through lead 32. Estimate vector elements (k, j, 0), (k, j, 1) and (k, j, 2) are therefore produced by multipliers 211, 212 and 213, respectively, to form an estimate vector $\vec{i}(k) \cdot k^j$ as given by Equation (5) and applied to a processor 210, and further to multipliers 214, 215 and 216.

A switch 209 is provided for establishing paths between the outputs of processor 210 and the outputs of sum-and-reset circuit 16 on the one hand and the inputs of registers 205, 206, 207 and the inputs of sum-and-reset circuit 16 on the other in accordance with the presence or absence of a reset pulse from reset circuit 15. During the absence of reset pulse, switch 209 establishes paths (as indicated by solid lines) from processor 210 to the registers and sum-and-reset circuit 16. In response to the reset pulse, switch 209 switches its paths as indicated by broken lines to couple the outputs of sum-and-reset circuit 16 to the registers for loading impulse response reset values h(0, 0, 0), h(0, 0, 1) and h(0, 0, 2) as given by Equation (8) if the channel estimator 20-j is 20-0, i.e., the zero-th order of impulse response or loading impulse response reset values h(0, j, 0), h(0, j, 1) and h(0, j, 2) as given by Equation (9), otherwise.

Processor 210 further receives the output of subtractor 19 through lead 30 and the outputs of registers 205, 206 and 207 to perform computations according to Equation (7). If the error signal from subtractor 19 can be ignored, processor 210 will produce impulse response vector elements h(k, j, 0), h(k, j, 1) and h(k, j, 2) at time k. These vector elements are coupled supplied through switch 209 and stored into registers 205, 206 and 207, respectively. The stored vector elements are fed back to processor 210 to produce a vector $\bar{h}(k+1, j)$ at time k+1. The process is repeated until the registers are initialized with reset values supplied from sum-and-reset circuit 16.

The outputs of registers 205, 206 and 207 are further applied to multipliers 214, 215 and 216, whose outputs are combined by an adder 208 to produce an estimate vector k'i(k)·h̄(k,j). This vector is applied through lead 34 to the adder 17 in which it is combined with the corresponding outputs of the other channel estimators to produce the vector r̂(k) according to Equation (6).

Figure 3:
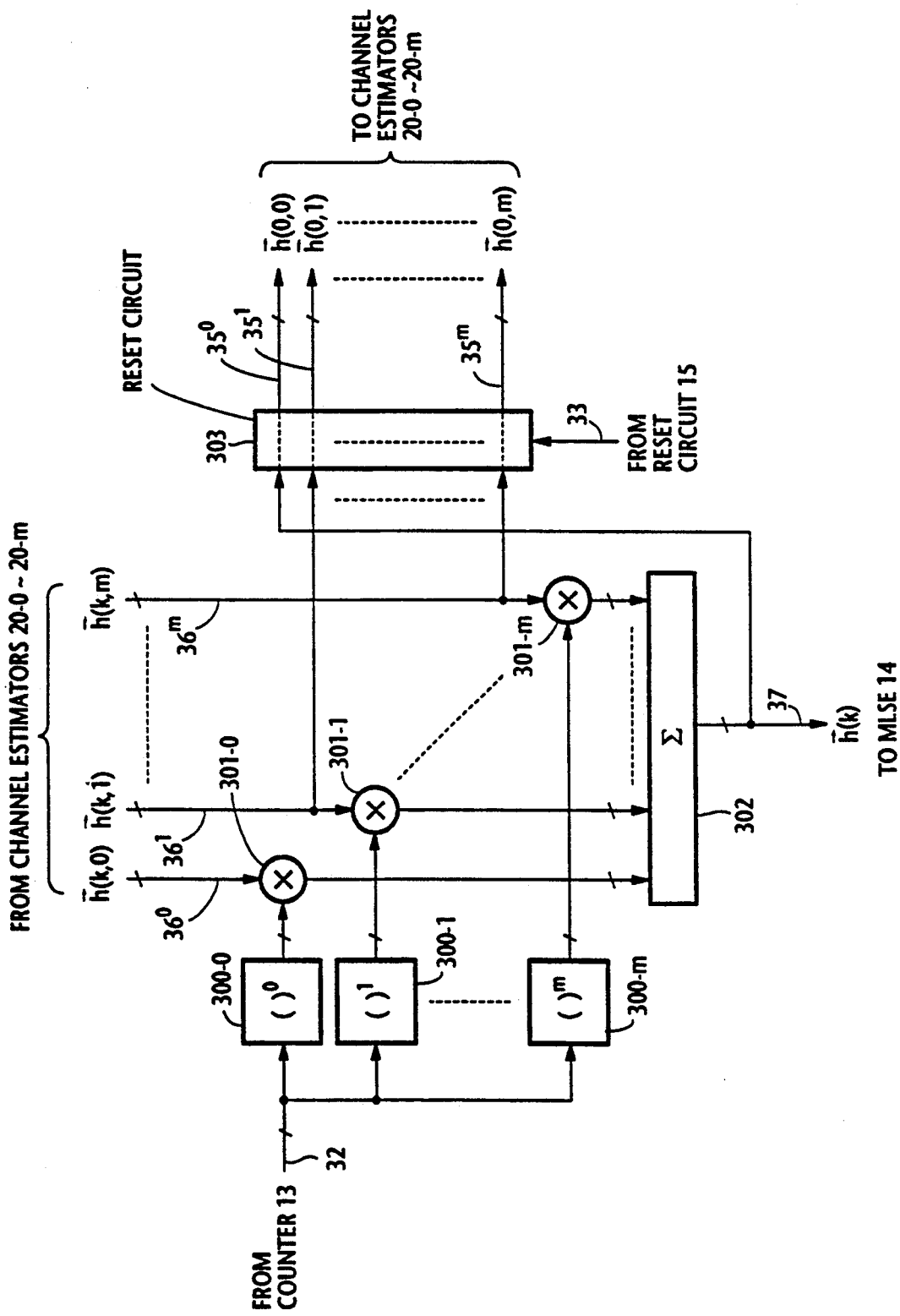
FIG. 3 is a block diagram of a first embodiment of the sum-and-reset circuit of FIG. 1.

As shown in FIG. 3, one embodiment of the sum-and-reset circuit 16 comprises raise-to-zero-th power multiplier 300-0, raise-to-first-power multiplier 300-1 . . . a raise-to-m-th power multiplier 300-m, all of which are coupled to receive the output of clock counter 13 through lead 32 to raise the clock count value to zero-th to m-th powers, respectively. The outputs of multipliers 300-0–300-m are applied to multipliers 301-0∼301-m, respectively, where they are multiplied with impulse response vectors h̄(k,0), h̄(k,1) and h̄(k,m) from respective channel estimators 20-0–20-m. Since the raising of a value to zero-th power results in unity, and since the raising of a value to first power is equal to multiplying that value by unity, multipliers 300-0, 300-1 and 301-0 can be dispensed with in a practical embodiment of this invention.

The outputs of all multipliers 301-0 through 301-m are summed by an adder 302 to produce a vector h̄(k) as given by Equation (4) for coupling to MLSE 14 through leads 37 to control the maximum likelihood sequence estimation algorithm so that the error ε reduces to a minimum. The output of adder 302 is further applied to a k-value reset circuit 303 to which the input vectors h̄(k,1) through h̄(k,m) are also applied. Reset circuit 303 responds to the reset pulse from reset circuit 15 by initializing the k-values of all of its input vectors to produce a set of impulse response reset vectors h̄(0,0), h̄(0,1) and h̄(0,m), these vectors being coupled through leads 35$^i$ to respective channel estimators 20-0∼20-m.

Figure 4:
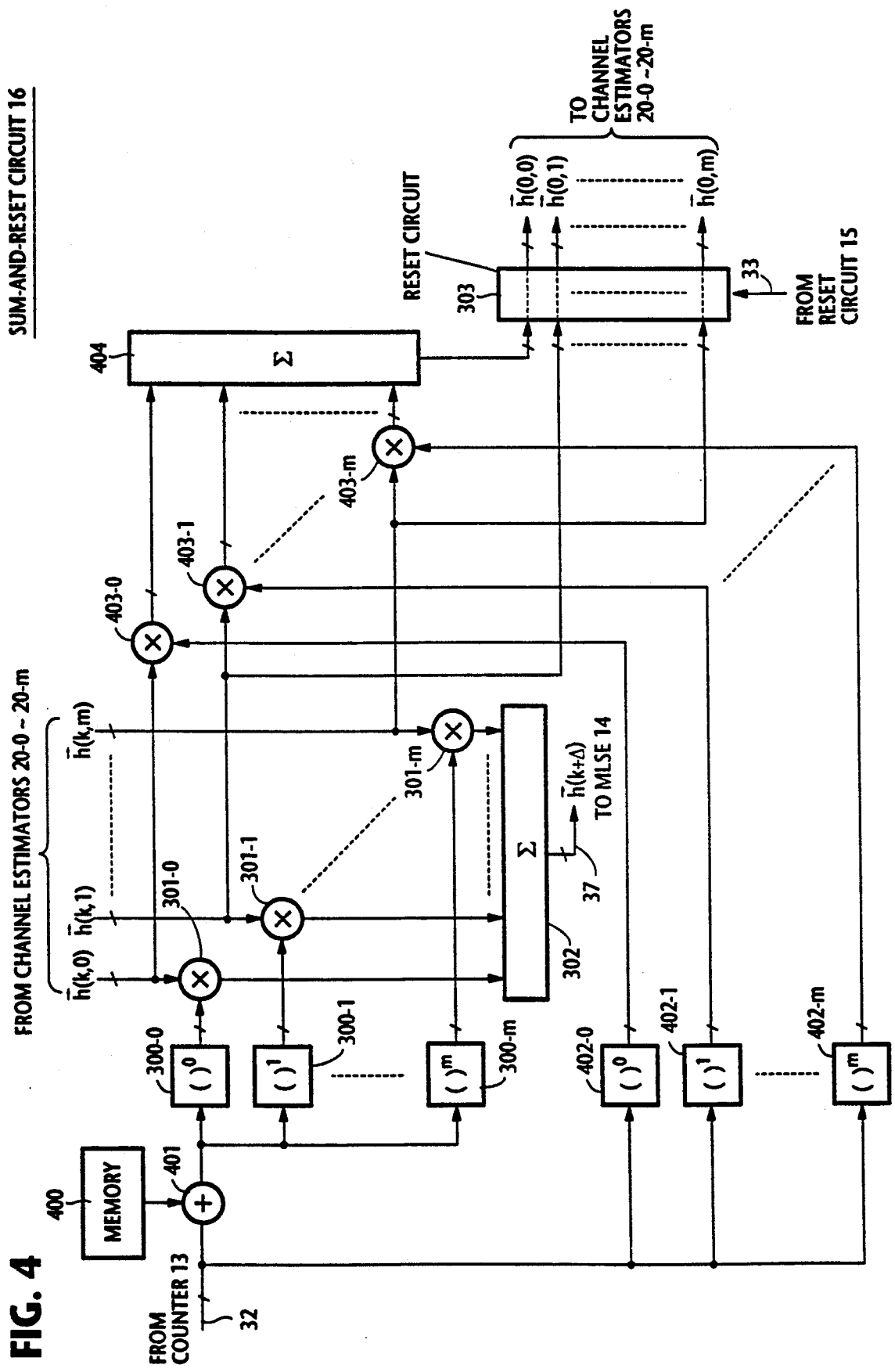
FIG. 4 is a block diagram of a modified embodiment of the sum-and-reset circuit.

There is an inherent delay involved with MLSE 14 during its decoding process. It is preferable that some provision be made for compensating for this modulation delay time. To this end, the sum-and-reset circuit 16 is modified as shown in FIG. 4 in which parts corresponding to those in FIG. 3 are marked with the same numerals as those in FIG. 3. The modification differs from FIG. 3 by the inclusion of a memory 400 in which is stored digital time data Δ representing the amount of time taken for MLSE 14 to produce a channel estimate i(k), and Equation (1) can be rewritten as follows:

$$\vec{h}(k+\Delta) = \vec{h}(k,m)(t+\Delta)^m + \vec{h}(k,m-1)(t+\Delta)^{m-1} + \ldots + \vec{h}(k,1)(t+\Delta) + \vec{h}(k,0)$$

Note that during time interval Δ, the variation of vector h̄(k) is assumed to be constant.

The stored data is summed with the output of clock counter 13 by an adder 401 and supplied to raise-to-power multipliers 300-0∼300-m whose outputs are connected respectively to corresponding multipliers 301-0∼30-1-m as in FIG. 3. Therefore, adder 302 produces an output vector h̄(k+Δ) for coupling to MLSE 14 through leads 37.

Raise-to-zero-th to raise-to-m-th power multipliers 402-0∼402-m are connected to the output of clock counter 13. Multipliers 403-0∼403-m are provided in a one-to-one correspondence to multipliers 402-0∼402-m for multiplying the input vectors from impulse response estimators 20-0∼20-m with the outputs of the corresponding multipliers 402. The outputs of multipliers 403 are summed by an adder 404 and fed into the reset circuit 303 to which the input vectors h̄(k,1) through h̄(k,m) are also applied as in FIG. 3.

The foregoing description shows only preferred embodiments of the present invention. Various modifications are apparent to those skilled in the art without departing from the scope of the present invention which is only limited by the appended claims. Therefore, the embodiments shown and described are only illustrative, not restrictive.

What is claimed is:

1. An adaptive maximum likelihood sequence estimator for receiving a signal transmitted through a communication channel having a time-varying channel impulse response, comprising:

a maximum likelihood sequence estimator for deriving a decision sequence of the received signal from an estimate of said channel impulse response;

a delay circuit for introducing a delay time to said received signal by an amount substantially corresponding to the amount of time taken by said maximum likelihood sequence estimator to produce said decision sequence;

a difference detector for generating an error signal representative of the difference between the delayed signal and a replica of the transmitted signal;

a time base for generating a time-count value which increases from an initial value to a predetermined value and generating a reset signal when said time-count value reaches said predetermined value;

(m+1) channel estimators provided respectively for zero-th order through m-th order of the channel impulse response, each of the channel estimators operating on said time-count value and being responsive to the output of said difference detector and the decision sequence from said maximum likelihood sequence estimator for deriving therefrom a first signal representing a respective order of said replica and a second signal representing a respective order of said channel impulse response, each of said first and second signals having a value incremental with said time-count value, where m is an integer equal to or greater than zero;

first summing means for summing the first signals from said channel estimators to produce a third signal and applying the third signal to said difference detector as said replica;

second summing means for summing said second signals from said channel estimators to produce a fourth signal and applying the fourth signal to said maximum likelihood sequence estimator as said estimate of the channel impulse response; and reset means for resetting said (m+1) channel estimators in response to the reset signal from said time base.

2. An adaptive maximum likelihood sequence estimator as claimed in claim 1, wherein said second summing means comprises:

a plurality of raise-to-power multipliers of zero-th to m-th order coupled to said time base for raising the time-count value to powers of respective order to produce a plurality of power-raised time-count values;

a plurality of normal multipliers for multiplying the second signals from said (m+1) channel estimators with the outputs of said raise-to-power multipliers, respectively; and an adder for summing the outputs of said normal multipliers to produce said fourth signal, wherein said reset means comprises:

means, responsive to said reset signal, for initializing said fourth signal from said adder and causing the zero-th order channel estimator to reset to the initialized fourth signal, and for initializing the second signals from the first-order to the m-th order channel estimators and causing the last-mentioned estimators to reset to the initialized second signals.

3. An adaptive maximum likelihood sequence estimator as claimed in claim 1, wherein said second summing means comprises;

means for storing data representing a predetermined amount of time;

a first adder for summing said data with the time-count value from said time base;

a plurality of first raise-to-power multipliers of zero-th to m-th order coupled to said first adder for raising the summed count value to powers of respective order to produce a plurality of power-raised time-count values;

a plurality of first normal multipliers for multiplying the second signals from said (m+1) channel estimators with the outputs of said first raise-to-power multipliers, respectively;

a second adder for summing the outputs of said first normal multipliers to produce said fourth signal;

a plurality of second raise-to-power multipliers of zero-th to m-th order coupled to said time-base for raising the time-count value to powers of respective order to produce a plurality of power-raised time-count values;

a plurality of second normal multipliers for multiplying the second signals from said (m+1) channel estimators with the outputs of said second raise-to-power multipliers; and a third adder for summing the outputs of said second normal multipliers to produce a summed signal, wherein said reset means comprises:

means, responsive to said reset signal, for initializing said summed signal from said third adder and causing the zero-th order channel estimator to reset to the initialized summed signal, and for initializing the second signals from the first-order to the m-th order channel estimators and causing the last-mentioned estimators to reset to the initialized second signals.

4. An adaptive maximum likelihood sequence estimator as claimed in claim 1, wherein each of said channel estimators comprises:

a plurality of shift registers connected to form a tapped delay line having a plurality of successive taps along the delay line for receiving said decision sequence from said maximum likelihood sequence estimator;

a first raise-to-power multiplier coupled to said time base for raising the time-count value to a power corresponding to the order of the channel estimator;

a plurality of first normal multipliers for multiplying the power-raised time-count value with components of said decision sequence respectively appearing at said successive taps;

a plurality of registers;

processor means for receiving signals from said difference detector, said first raise-to-power multiplier and said registers and performing calculations on the received signals to produce a plurality of error-compensated signal components of the second signal of the channel estimator for coupling to said registers;

a plurality of second normal multipliers for multiplying the outputs of said first normal multipliers with contents of said registers, respectively; and a first adder for summing the outputs of said first normal multipliers to produce a sum and applying the sum to said first summing means as said first signal, wherein said second summing means comprises:

a plurality of second raise-to-power multipliers of zero-th to m-th order coupled to said time base for raising the time-count value to powers of respective order to produce a plurality of power-raised time-count values;

a plurality of third normal multipliers for multiplying the second signals from said (m+1) channel estimators with the outputs of said second raise-to-power multipliers, respectively; and a third adder for summing the outputs of said third normal multipliers to produce said fourth signal, wherein said reset means comprises;

means, responsive to said reset signal, for initializing said fourth signal from said third adder and causing the zero-th order channel estimator to reset to the initialized fourth signal, and for initializing the second signals from the first-order to the m-th order channel estimators and causing the last-mentioned estimators to respectively reset to the initialized second signals.

5. An adaptive maximum likelihood sequence estimator as claimed in claim 1, wherein each of said channel estimators comprises:

a plurality of shift registers connected to form a tapped delay line having a plurality of successive taps along the delay line for receiving said decision sequence from said maximum likelihood sequence estimator;

a first raise-to-power multiplier coupled to said time base for raising the time-count value to a power corresponding to the order of the channel estimator;

a plurality of first normal multipliers for multiplying the power-raised time-count value with components of said decision sequence respectively appearing at said successive taps;

a plurality of registers;

processor means for receiving signals from said difference detector, said first raise-to-power multiplier and said registers and performing calculations on the received signals to produce a plurality of error-compensated signal components of the second signal of the channel estimator for coupling to said registers;

a plurality of second normal multipliers for multiplying the outputs of said first normal multipliers with contents of said registers, respectively; and an adder for summing the outputs of said first normal multipliers to produce a sum and applying the sum to said first summing means as said first signal, wherein said reset means comprises:

means, responsive to said reset signal, for initializing said fourth signal from said second summing means and resetting the registers of the zero-th order channel estimator to the initialized fourth signal and resetting the registers of the first- to the m-th channel estimators to initial values of the error-compensated signal components of the respective channel estimators, and wherein said second summing means comprises:

means for storing data representing a predetermined amount of time;

a second adder for summing said data with the time-count value from said time base;

a plurality of second raise-to-power multipliers of zero-th to m-th order coupled to said second adder for raising the summed count value to powers of respective order to produce a plurality of power-raised time-count values;

a plurality of third normal multipliers for multiplying the second signals from said (m+1) channel estimators with the outputs of said second raise-to-power multipliers, respectively;

a third adder for summing the outputs of said third normal multipliers to produce said fourth signal;

a plurality of third raise-to-power multipliers of zero-th to m-th order coupled to said time-base for raising the time-count value to powers of respective order to produce a plurality of power-raised time count values;

a plurality of fourth normal multipliers for multiplying the second signals from said (m+1) channel estimators with the outputs of said third raise-to-power multipliers; and a fourth adder for summing the outputs of said fourth normal multipliers to produce a summed signal, wherein said reset means comprises:

means, responsive to said reset signal, for initializing said summed signal from said fourth adder and causing the zero-th order channel estimator to reset to the initialized summed signal, and for initializing the second signals from the first-order to the m-th order channel estimators and causing the last-mentioned estimators to respectively reset to the initialized second signals.

6. An adaptive maximum likelihood sequence estimator for receiving a signal transmitted through a communication channel having a time-varying channel impulse response, comprising:

a time base for generating a clock pulse and a time-count value of said clock pulse which increases from an initial value to a predetermined value and generating a reset signal at periodic intervals when said time-count value reaches said predetermined value;

an analog-to-digital converter for sampling the received signal in response to said clock pulse and converting the sampled signal into a digital signal;

a maximum likelihood sequence estimator coupled to the analog-to-digital converter for deriving a decision sequence of the digital signal from an estimate of said channel impulse response;

a delay circuit for introducing a delay time to said digital signal by an amount substantially corresponding to the amount of time taken by said maximum likelihood sequence estimator to produce said decision sequence;

a difference detector for generating an error signal representative of the difference between the delayed signal and a replica of the transmit signal;

(m+1) channel estimators provided respectively for zero-th order through m-th order of the channel impulse response, each of the channel estimators operating on said time-count value and being responsive to the output of said difference detector and the decision sequence from said maximum likelihood sequence estimator for deriving therefrom a first signal representing a respective order of said channel impulse response, each of said first and second signals having a value incremental with said time-count value, where m is an integer equal to or greater than zero;

first summing means for summing the first signals from said channel estimators to produce a third signal and applying the third signal to said difference detector as said replica;

second summing means for summing the second signals from said channel estimators to produce a fourth signal and applying the fourth signal to said maximum likelihood sequence estimator as said estimate of the channel impulse response; and reset means, responsive to said reset signal, for initializing said fourth signal from said second summing means and causing the zero-th order channel estimator to reset to the initialized fourth signal, and for initializing the second signals from the first-order to the m-th order channel estimators and causing the last-mentioned estimators to respectively reset to the initialized second signals.

* * * * *